(12) United States Patent
Kaneko

(10) Patent No.: US 8,508,253 B2
(45) Date of Patent: Aug. 13, 2013

(54) NONVOLATILE LOGIC CIRCUIT AND A METHOD FOR OPERATING THE SAME

(75) Inventor: Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/465,880

(22) Filed: May 7, 2012

(65) Prior Publication Data

US 2012/0217996 A1    Aug. 30, 2012

Related U.S. Application Data

(63) Continuation of application No. 13/305,459, filed on Nov. 28, 2011, now Pat. No. 8,427,202, which is a continuation of application No. PCT/JP2011/002993, filed on May 30, 2011.

(30) Foreign Application Priority Data

Nov. 4, 2010   (JP) .................... 2010-247070

(51) Int. Cl.
*H03K 19/173*   (2006.01)
*G11C 11/22*   (2006.01)

(52) U.S. Cl.
USPC .......... 326/38; 326/41; 365/145; 365/65; 365/130

(58) Field of Classification Search
None
See application file for complete search history.

(56) References Cited

U.S. PATENT DOCUMENTS

| | | | |
|---|---|---|---|
| 8,023,309 B2 | 9/2011 | Tanaka et al. | |
| 8,199,555 B2 | 6/2012 | Kaneko | |
| 8,284,588 B2 | 10/2012 | Kaneko | |
| 8,390,322 B2* | 3/2013 | Kaneko ................ | 326/38 |
| 2006/0114018 A1 | 6/2006 | Sugahara et al. | |
| 2006/0139844 A1 | 6/2006 | Kameyama et al. | |
| 2009/0097299 A1 | 4/2009 | Tanaka et al. | |
| 2011/0292718 A1 | 12/2011 | Suzuki et al. | |
| 2011/0309859 A1 | 12/2011 | Kaneko | |
| 2012/0008365 A1 | 1/2012 | Kaneko | |
| 2012/0068732 A1 | 3/2012 | Kaneko | |
| 2012/0112787 A1* | 5/2012 | Kaneko ................ | 326/38 |
| 2012/0217996 A1 | 8/2012 | Kaneko | |
| 2012/0217997 A1 | 8/2012 | Kaneko | |

OTHER PUBLICATIONS

Notice of Allowance mailed Jan. 22, 2013 issued from the U.S. Patent Office in U.S. Appl. No. 13/305,459.
International Search Report issued in International Patent Application No. PCT/JP2011/002993 filed on May 30, 2011.

* cited by examiner

*Primary Examiner* — Vibol Tan
(74) *Attorney, Agent, or Firm* — McDermott Will & Emery LLP

(57) ABSTRACT

A nonvolatile logic circuit includes logic configuration electrodes and input electrodes. The nonvolatile logic circuit is programmable to any one of the logics between the input signals selected from logical conjunction (AND), logical disjunction (OR), logical non-conjunction (NAND), logical non-disjunction (NOR), and logical exclusive disjunction (XOR) by changing applied voltages to the logic configuration electrodes.

12 Claims, 16 Drawing Sheets

① First input signal
$\overline{①}$ Negation of the first input signal
② Second input signal
$\overline{②}$ Negation of the second input signal ① First input signal $\overline{①}$ Negation of the first input signal ② Second input signal $\overline{②}$ Negation of the second input signal

Fig. 3

| First input signal | Second input signal | OUTPUT | | | | |
|---|---|---|---|---|---|---|
| | | AND | OR | NAND | NOR | XOR |
| 1 | 1 | 1 | 1 | 0 | 0 | 0 |
| 0 | 1 | 0 | 1 | 1 | 0 | 1 |
| 1 | 0 | 0 | 1 | 1 | 0 | 1 |
| 0 | 0 | 0 | 0 | 1 | 1 | 0 |

Fig. 4

|  | AND | OR | NAND | NOR | XOR |
|---|---|---|---|---|---|
| First logic configuration electrode 18a | ON | ON | OFF | OFF | OFF |
| Second logic configuration electrode 18b | OFF | ON | ON | OFF | ON |
| Third logic configuration electrode 18c | OFF | ON | ON | OFF | ON |
| Fourth logic configuration electrode 18d | OFF | OFF | ON | ON | OFF |

Fig. 5

| | AND | OR | NAND | NOR | XOR |
|---|---|---|---|---|---|
| First logic configuration electrode 18a | -10 | -10 | 10 | 10 | 10 |
| Second logic configuration electrode 18b | 10 | -10 | -10 | 10 | -10 |
| Third logic configuration electrode 18c | 10 | -10 | -10 | 10 | -10 |
| Fourth logic configuration electrode 18d | 10 | 10 | -10 | -10 | 10 |

Unit : Volt

Fig. 6

|  | Applied voltages | | | | | | | | Logic | | | | |
|---|---|---|---|---|---|---|---|---|---|---|---|---|---|
|  | 17a | 17b | 17c | 17d | 17e | 17f | 17g | 17h | AND | OR | NAND | NOR | XOR |
| First state | -10 | -10 | 10 | 10 | -10 | 10 | -10 | 10 | low | low | high | high | high |
| Second state | 10 | 10 | -10 | -10 | -10 | 10 | -10 | 10 | high | low | low | high | low |
| Third state | -10 | -10 | 10 | 10 | 10 | -10 | 10 | -10 | high | low | low | high | low |
| Fourth state | 10 | 10 | -10 | -10 | 10 | -10 | 10 | -10 | high | high | low | low | high |

Unit: Volt

PRIOR ART

PRIOR ART

PRIOR ART

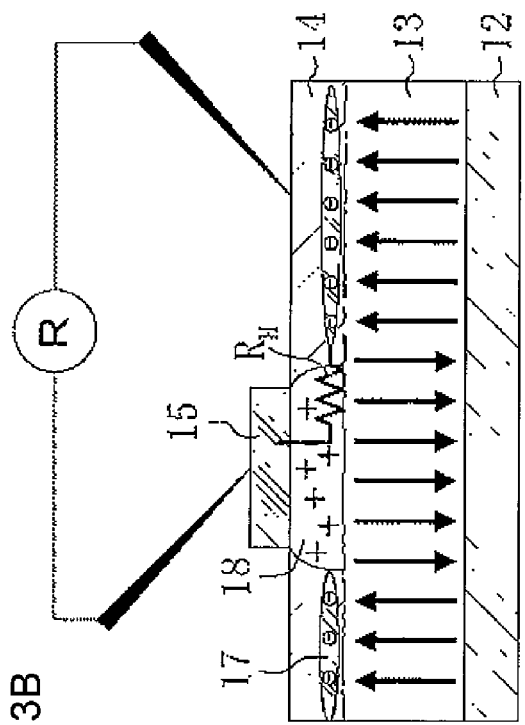
Fig. 13A PRIOR ART
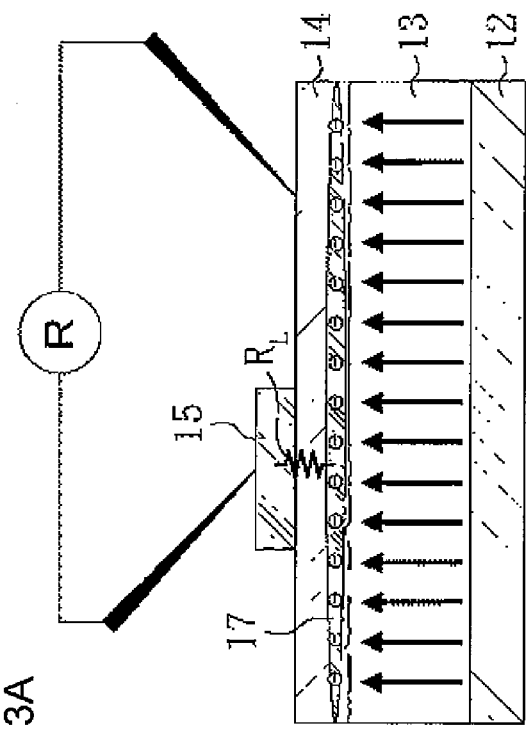
Fig. 13B PRIOR ART
Fig. 13C PRIOR ART

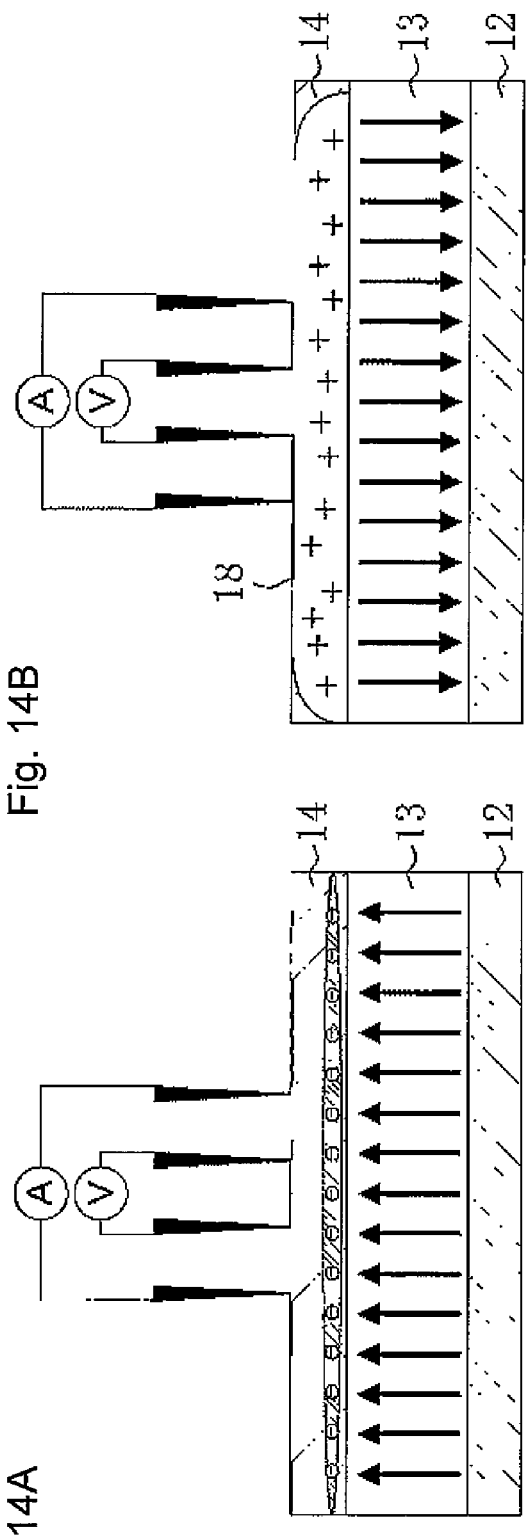

NONVOLATILE LOGIC CIRCUIT AND A METHOD FOR OPERATING THE SAME

CROSS-REFERENCE TO RELATED APPLICATIONS

This application is a Continuation of U.S. application Ser. No. 13/305,459 filed Nov. 28, 2011 now U.S. Pat. No. 8,427,202, which is a Continuation of PCT/JP2011/002993 filed May 30, 2011, which claims foreign priority of JP 2010-247070 filed on Nov. 4, 2010, the entire contents of each of which are incorporated herein by reference.

TECHNICAL FIELD

The present disclosure relates to a non volatile logic circuit and a method for operating the nonvolatile logic circuit.

BACKGROUND

FIG. 10 to FIG. 14 correspond to FIG. 1 to FIG. 5 of U.S. Patent Publication No. 2009/0097299, respectively.

As shown in FIG. 10, a semiconductor memory device 10 according to US 2009/0097299 includes a stacked layer of a ferroelectric layer 13 and a semiconductor layer 14. In the semiconductor memory device 10, a first electrode 12 is formed on the stacking layer at the ferroelectric layer 13 side and a plurality of second electrodes 15a, 15b and 15c are formed on the stacked layer at the semiconductor layer 14 side. These layers are formed on a substrate 11.

FIGS. 11A and 11B show an initial state of the semiconductor memory device of FIG. 10. FIG. 11A is a cross-sectional perspective view and FIG. 11B is an equivalent circuit diagram.

For example, when an n-type semiconductor material is used for the semiconductor layer 14, all directions of polarization 16 are oriented in the same direction so that the polarization 16 of the ferroelectric layer 13 is coupled with electrons (i.e., majority carriers) of the semiconductor layer 14 in an initial state. In this case, two-dimensional electrons 17 are induced by the polarization of the ferroelectric layer 13 and are accumulated around the interface between the semiconductor layer 14 and the ferroelectric layer 13. In this state, the semiconductor layer 14 is in a low resistance state. Thus, the semiconductor layer 14 serves as a channel in which a current flows in the same manner as a metal electrode and can be used as the same kind of electrodes as a metal electrode. In such a case, as shown in FIG. 11B, a conduction state between the semiconductor layer 14 and each of the second electrodes 15a, 15b and 15c is short-circuited.

In this state, as shown in FIG. 12A, when a bias voltage relative to the first electrode 12 is applied to the second electrode 15c, only the polarization in a part of the ferroelectric layer 13 located in which the second electrode 15c is formed is inverted, and the polarization is oriented in the direction which causes exclusion of electrons in the semiconductor layer 14. Accordingly, only the part 18 of the semiconductor layer 14 located in the region in which the second electrode 15c is formed is depleted and thus becomes in a high resistance state. As a result, as shown in FIG. 12B, a state between the semiconductor layer 14 and the second electrode 15c is an open-circuited state.

FIGS. 13A, 13B and 13C show two resistance states of the part of the semiconductor layer 14 located in a region in which the second electrode 15 is formed. FIG. 13A is a cross-sectional view of the part when it is in a low resistance state, FIG. 13B is a cross-sectional view of the part when it is in a high resistance state, and FIG. 13C is a table showing sheet resistance values between the semiconductor layer 14 and the second electrode 15. As shown in the table, each of the parts of the semiconductor layer 14 located in regions in which the second electrodes 15a, 15b and 15c are formed can be in either of two states having different sheet resistance values because of the polarization assist effect of the ferroelectric layer 13.

In the state shown in FIG. 13B, when a low bias voltage relative to the first electrode 12 is applied to the second electrode 15, the polarization of the ferroelectric layer 13 is inverted again. Thus, the polarization is oriented in the direction in which electrons are accumulated and the part 18 of the semiconductor layer 14 located in the region in which the second electrode 15 is formed is back to a low resistance state. As a result, the conduction state between the semiconductor layer 14 and the second electrode 15 becomes in a short circuit state again.

FIGS. 14A, 14B and 14C show measurements for resistance values of the semiconductor layer 14 using a four-probe method. FIG. 14A is a diagram illustrating how the resistance value of the semiconductor layer 14 is measured when it is in a low resistance state where two-dimensional electrons are accumulated, FIG. 14B is a diagram illustrating how the resistance value of the semiconductor layer 14 is measured when it is in a high resistance state where two-dimensional electrons are excluded, and FIG. 14C is a table showing respective measurement results. As shown in the table of FIG. 14C, the resistance value of the semiconductor layer 14 is about $1 \times 10^3$ ohm per square or less in the low resistance state and about $1 \times 10^6$ ohm per square or more in the high resistance state.

SUMMARY

Problem(s) to be Solved

The purpose of the present disclosure is to provide a novel nonvolatile logic circuit and a method for operating the nonvolatile logic circuit utilizing change of resistance states.

Means to Solve the Problem(s)

One exemplary aspect of the present disclosure relates to a method of operating a non-volatile logic circuit. The method includes the following steps. of (a) to (d). The step (a) is a step of preparing the non-volatile logic circuit. The non-volatile logic circuit includes a control electrode, a ferroelectric layer, a semiconductor layer, and an electrode group. The control electrode, the ferroelectric layer, the semiconductor layer, and the electrode group are stacked in this order. The semiconductor layer is an n-type semiconductor layer. The semiconductor layer is divided into first to fourth semiconductor portions. The electrode group includes a power electrode, an output electrode, first to eighth input electrodes, and first to fourth logic configuration electrodes.

In this disclosure, X direction, Y-direction, and Z-direction denote a longitudinal direction of the ferroelectric layer (from the power electrode to the output electrode), a direction orthogonal to the longitudinal direction, and a layer (film) stack direction, respectively. The first to eighth input electrodes and the first to fourth logic configuration electrodes are interposed between the power electrode and the output electrode along the X-direction. The first to fourth logic configuration electrodes are disposed along the Y-direction. The first to fourth input electrodes are disposed along the Y-direction. The fifth to eighth input electrodes are disposed along the Y-direction.

Further, the first input electrode, the fifth input electrode, and the first logic configuration electrode are disposed along the X-direction on the first semiconductor portion. The second input electrode, the sixth input electrode, and the second logic configuration electrode are disposed along the X-direction on the second semiconductor portion. The third input electrode, the seventh input electrode, and the third logic configuration electrode are disposed along the X-direction on the third semiconductor portion. The fourth input electrode, the eighth input electrode, and the fourth logic configuration electrode are disposed along the X-direction on the fourth semiconductor portion.

Further, a first insulation part is interposed between the first semiconductor portion and the second semiconductor portion to insulate the first semiconductor portion from the second semiconductor portion, a second insulation part is interposed between the second semiconductor portion and the third semiconductor portion to insulate the second semiconductor portion from the third semiconductor portion, and a third insulation part is interposed between the third semiconductor portion and the fourth semiconductor portion to insulate the third semiconductor portion from the fourth semiconductor portion.

The method further includes a step (b) of configuring one logic in the nonvolatile logic circuit selected from logical conjunction (AND), logical disjunction (OR), logical non-conjunction (NAND), logical non-disjunction (NOR), and logical exclusive disjunction (XOR). The logic is configured by applying voltages V1, VA, VB, VC, and VD which denote the voltages applied to the control electrode, and the first to fourth logic configuration electrodes, respectively.

When the logical conjunction (AND) is configured, the voltages which satisfy the following inequality (I) are applied, $$V1>VA, V1<VB, V1<VC, \text{ and } V1<VD \tag{I}$$

When the logical disjunction (OR) is configured, the voltages which satisfy the following inequality (II) are applied, $$V1>VA, V1>VB, V1>VC, \text{ and } V1<VD \tag{II}$$

When the logical non-conjunction (NAND) is configured, the voltages which satisfy the following inequality (III) are applied, $$V1<VA, V1>VB, V1<VC, \text{ and } V1>VD \tag{III}$$

When the logical non-disjunction (NOR) is configured, the voltages which satisfy the following inequality (IV) are applied, $$V1<VA, V1<VB, V1<VC, \text{ and } V1>VD \tag{IV}$$

When the logical exclusive disjunction (XOR) is configured, the voltages which satisfy the following inequality (V) are applied, $$V1<VA, V1>VB, V1>VC, \text{ and } V1<VD \tag{V}$$

The method also includes a step (c) of writing one of the states selected from the group consisting of first to fourth states into the non-volatile logic circuit. The state is written by applying voltages Va to Vh which denote voltages applied to the first to eighth input electrodes, respectively.

When the first state is written, voltages which satisfy the following inequality (VI) are applied, $$V1>Va, V1>Vb, V1<Vc, V1<Vd, V1>Ve, V1<Vf,$$
$$V1>Vg, \text{ and } V1<Vh \tag{VI}$$

When the second state is written, voltages which satisfy the following inequality (VII) are applied, $$V1<Va, V1<Vb, V1>Vc, V1>Vd, V1>Ve, V1<Vf,$$
$$V1>Vg, \text{ and } V1<Vh \tag{VII}$$

When the third state is written, voltages which satisfy the following inequality (VIII) are applied, $$V1>Va, V1>Vb, V1<Vc, V1<Vd, V1<Ve, V1>Vf,$$
$$V1<Vg, \text{ and } V1>Vh \tag{VIII}$$

When the fourth state is written, voltages which satisfy the following inequality (IX) are applied, $$V1<Va, V1<Vb, V1>Vc, V1>Vd, V1<Ve, V1>Vf,$$
$$V1<Vg, \text{ and } V1>Vh \tag{IX}$$

The method further includes a step (d) of measuring a current generated by applying a potential difference between the power electrode and the output electrode to determine whether the semiconductor layer between the power electrode and the output electrode is a high resistance state or a low resistance state on the basis of the current.

Another exemplary aspect of the present disclosure relates to a non-volatile logic circuit, including a control electrode, a ferroelectric layer, a semiconductor layer, and an electrode group. The control electrode, the ferroelectric layer, the semiconductor layer, and the electrode group are stacked in this order. The semiconductor layer is divided into first to fourth semiconductor portions. The electrode group includes a power electrode, an output electrode, first to eighth input electrodes, and first to fourth logic configuration electrodes.

When X direction, Y-direction, and Z-direction denote a longitudinal direction of the ferroelectric layer, a direction orthogonal to the longitudinal direction (from the power electrode to the output electrode), and a layer (film) stack direction, respectively, he first to eighth input electrodes and the first to fourth logic configuration electrodes are interposed between the power electrode and the output electrode along the X-direction. the first to fourth logic configuration electrodes are disposed along the Y-direction, the first to fourth input electrodes are disposed along the Y-direction, and the first to fourth input electrodes are disposed along the Y-direction. The first input electrode, the fifth input electrode, and the first logic configuration electrode are disposed along the X-direction, the second input electrode, the sixth input electrode, and the second logic configuration electrode are disposed along the X-direction, the third input electrode, the seventh input electrode, and the third logic configuration electrode are disposed along the X-direction, and the fourth input electrode, the eighth input electrode, and the fourth logic configuration electrode are disposed along the X-direction.

Further, the first input electrode, the fifth input electrode, and the first logic configuration electrode are disposed along the X-direction on the first semiconductor portion. The second input electrode, the sixth input electrode, and the second logic configuration electrode are disposed along the X-direction on the second semiconductor portion. The third input electrode, the seventh input electrode, and the third logic configuration electrode are disposed along the X-direction on the third semiconductor portion. The fourth input electrode, the eighth input electrode, and the fourth logic configuration electrode are disposed along the X-direction on the fourth semiconductor portion.

Further, a first insulation part is interposed between the first semiconductor portion and the second semiconductor portion to insulate the first semiconductor portion from the second semiconductor portion, a second insulation part is interposed between the second semiconductor portion and the third semiconductor portion to insulate the second semiconductor portion from the third semiconductor portion, and a third insulation part is interposed between the third semiconductor portion and the fourth semiconductor portion to insulate the third semiconductor portion from the fourth semiconductor portion Effects The present disclosure can provide a novel nonvolatile logic circuit and a method for operating the nonvolatile logic circuit which can be changed to one logic selected from logical conjunction (AND), logical disjunction (OR), logical non-conjunction (NAND), logical non-disjunction (NOR), and logical exclusive disjunction (XOR).

BRIEF DESCRIPTION OF THE DRAWINGS

FIG. 3 shows the table of truth values in the one example of the present disclosure.

FIG. 4 shows the relationship between the five logics and the logic configuration electrodes 18a-18d.

FIG. 5 shows the relationship between the five logics and the specific voltages applied to the logic configuration electrodes 18a-18d.

FIG. 6 shows the relationship among the first to fourth states, the applied voltages, and the five logics.

FIG. 13A shows FIG. 4(a) of US 2009/0097299.
FIG. 13B shows FIG. 4(b) of US 2009/0097299.
FIG. 13C shows FIG. 4(c) of US 2009/0097299.
FIG. 14A shows FIG. 5(a) of US 2009/0097299.
FIG. 14B shows FIG. 5(b) of US 2009/0097299.
FIG. 14C shows FIG. 5(c) of US 2009/0097299.

DETAILED DESCRIPTION

Multiple examples of the present disclosure are described below with reference to the figures.

(Structure of the Nonvolatile Logic Circuit 20)

Figure 1A:
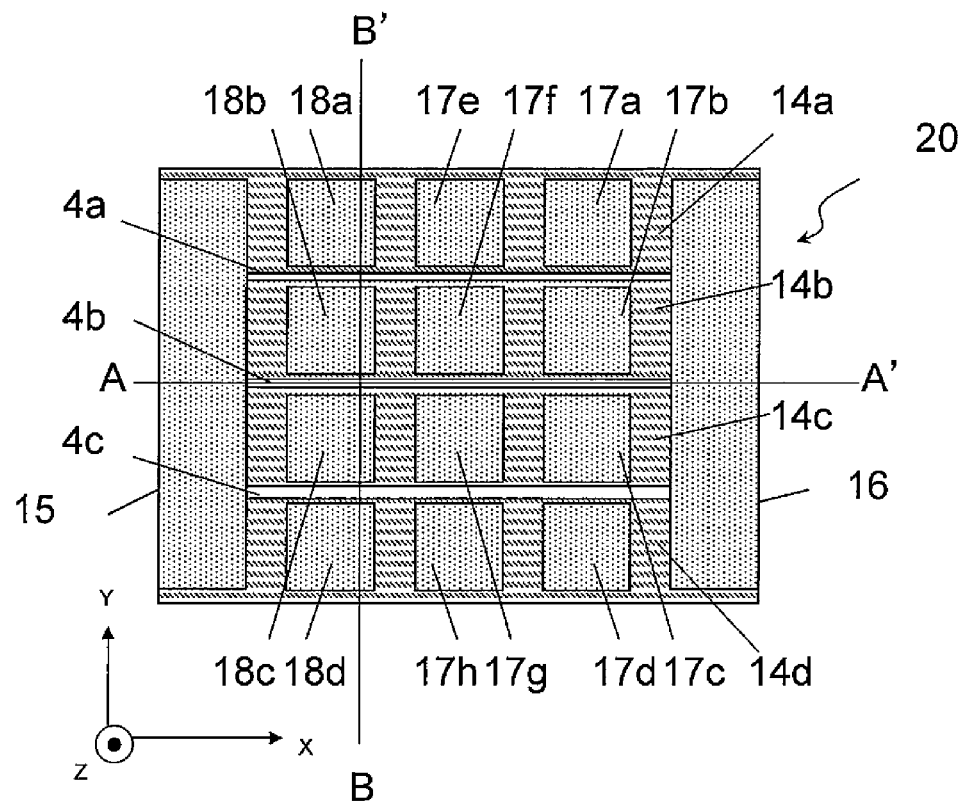
FIG. 1A shows an exemplary top view of the nonvolatile logic circuit 20 according to one example of the present disclosure.
Figure 1B:
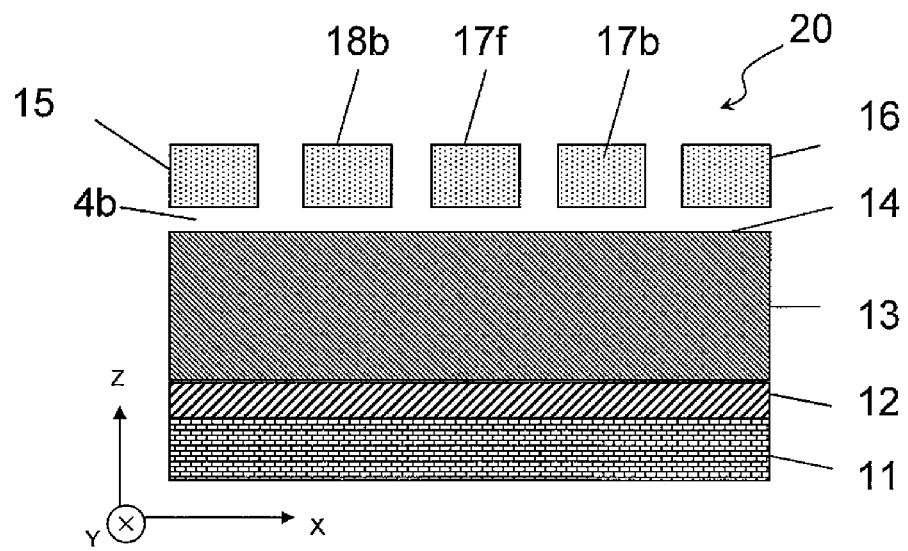
FIG. 1B shows the cross-sectional view of A-A' in FIG. 1A.

FIG. 1A shows a top view of the nonvolatile logic circuit 20 according to one example. FIG. 1B shows the cross-sectional view of the A-A' line in FIG. 1A.

As shown in FIG. 1B, a control electrode 12, a ferroelectric film 13, a semiconductor film 14, and an electrode group 15-18 are stacked in this order on the substrate 11.

The electrode group 15-18 includes a power electrode 15, an output electrode 16, first to eighth input electrodes 17a-17h, and first to fourth logic configuration electrodes 18a-18d.

As shown in FIG. 1A and FIG. 1B, the X direction, the Y-direction, and the Z-direction denote a longitudinal direction of the ferroelectric film 13 (i.e., from the power electrode 15 to the output electrode 16), a direction orthogonal to the longitudinal direction, and the film stack direction, respectively.

As shown in FIG. 1A, the semiconductor film 14 is divided into first to fourth semiconductor portions 14a-14d. It is preferred that the first to fourth semiconductor portions 14a-14d are rectangular. The respective longitudinal directions of the first to fourth semiconductor portions 14a-14d are parallel to the X-direction. The first to eighth input electrodes 17a-17h and the first to fourth logic configuration electrodes 18a-18d are interposed between the power electrode 15 and the output electrode 16 along the X-direction. The first to fourth logic configuration electrodes 18a-18d are disposed along the Y-direction. The first to fourth input electrodes 17a-17d are disposed along the Y-direction. The fifth to eighth input electrodes 17e-17h are disposed along the Y-direction.

The first input electrode 17a, the fifth input electrode 17e, and the first logic configuration electrode 18a are disposed along the X-direction on the first semiconductor portion 14a. In FIG. 1A, for example, the fifth input electrode 17e is interposed between the first logic configuration electrode 18a and the first input electrode 17a along the X-direction. However, either of the first input electrode 17a or the first logic configuration electrode 18a may be interposed between the other two electrodes.

The second input electrode 17b, the sixth input electrode 17f, and the second logic configuration electrode 18b are disposed along the X-direction on the second semiconductor portion 14b. In FIG. 1A and FIG. 1B, for example, the sixth input electrode 17f is interposed between the second logic configuration electrode 18b and the second input electrode 17b along the X-direction. However, either of the second input electrode 17b or the second logic configuration electrode 18b may be interposed between the other two electrodes.

The third input electrode 17c, the seventh input electrode 17g, and the third logic configuration electrode 18c are disposed along the X-direction on the third semiconductor portion 14c. In FIG. 1A, for example, the seventh input electrode 17g is interposed between the third logic configuration electrode 18c and the third input electrode 17c along the X-direction. However, either of the third input electrode 17c or the third logic configuration electrode 18c may be interposed between the other two electrodes.

The fourth input electrode 17d, the eighth input electrode 17h, and the fourth logic configuration electrode 18d are disposed along the X-direction on the fourth semiconductor portion 14d. In FIG. 1A, for example, the eighth input electrode 17h is interposed between the fourth logic configuration electrode 18d and the fourth input electrode 17d along the X-direction. However, either of the fourth input electrode 17d or the fourth logic configuration electrode 18d may be interposed between the other two electrodes.

As shown in FIG. 1A, a first insulation part 4a, a second insulation part 4b, and a third insulation part 4c are provided along the X-direction in the semiconductor layer 14.

The first insulation part 4a is interposed between the first semiconductor portion 14a and the second semiconductor portion 14b to insulate electrically the first semiconductor portion 14a from the second semiconductor portion 14b. Namely, the first insulation part 4a insulates electrically the three electrodes of the first logic configuration electrode 18a, the first input electrode 17a, and the fifth input electrode 17e from the three electrodes of the second logic configuration electrode 18b, the second input electrode 17b, and the sixth input electrode 17f.

The second insulation part 4b is interposed between the second semiconductor portion 14b and the third semiconductor portion 14c to insulate electrically the second semiconductor portion 14b from the third semiconductor portion 14c. Namely, the second insulation part 4b insulates electrically the three electrodes of the second logic configuration electrode 18b, the second input electrode 17b, and the sixth input electrode 17f from the three electrodes of the third logic configuration electrode 18c, the third input electrode 17c, and the seventh input electrode 17g.

The third insulation part 4c is interposed between the third semiconductor portion 14c and the fourth semiconductor portion 14d to insulate electrically the third semiconductor portion 14c from the fourth semiconductor portion 14d. Namely, the third insulation part 4c insulates electrically the three electrodes of the third logic configuration electrode 18c, the third input electrode 17c, and the seventh input electrode 17g from the three electrodes of the fourth logic configuration electrode 18d, the fourth input electrode 17d, and the eighth input electrode 17h.

As shown in FIG. 1B, the upper surface of the ferroelectric film 13 is exposed at the respective bottom surfaces of the first to third insulation parts 4a to 4c. The first to third insulation parts 4a to 4c may extend into the ferroelectric film 13. Namely, the interior or the bottom surface of the ferroelectric film 13 is exposed at the respective bottom surfaces of the first to third insulation parts 4a to 4c.

Figure 1C:
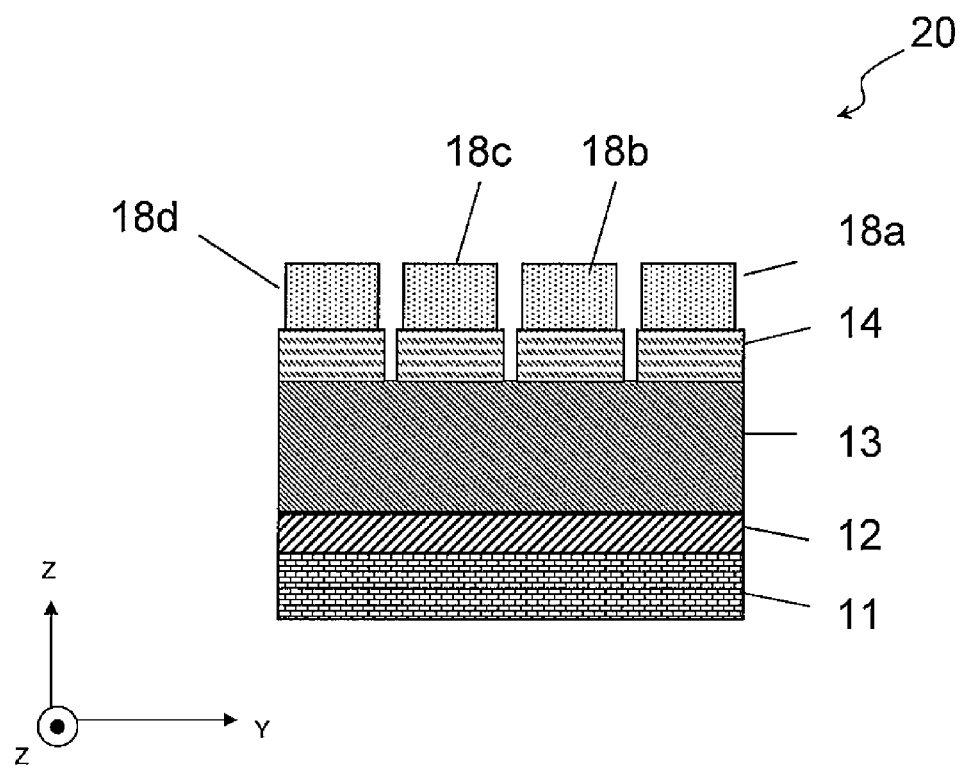
FIG. 1C shows the cross-sectional view of B-B' in FIG. 1A.

The first insulation part 4a may be a groove (see, FIG. 1C) or be made of an insulator. The groove may be vacuated. The groove may be filled with gas such as air. An example of the insulator is silicon oxide. Examples of the second insulation part 4b and the third insulation part 4c also are grooves or insulators, similarly to the first insulation part 4a.

In the non-volatile logic circuit 20, the current through the semiconductor film 14 is determined depending on the direction of the polarization of the ferroelectric film 13. Namely, when the polarization of the ferroelectric film 13 agrees with the +Z direction, electrons induced in the semiconductor film 14 cause the semiconductor film 14 to have low resistance. On the contrary, when the polarization of the ferroelectric film 13 agrees with the −Z direction, depletion of the electron away from the semiconductor film 14 causes the semiconductor film 14 to have high resistance.

Voltages between input electrodes 17a-17h and the control electrode 12 and between the logic configuration electrodes 18a-18d and the control electrode 12 are applied to determine the resistance value of the semiconductor film 14 between the power electrode and the output electrode. This allows the resistance value between the power electrode 15 and the output electrode 16 to be changed. The change of the resistance value allows the nonvolatile logic circuit 20 to execute logic calculation. The logic calculation is described below.

It is noted that it is not necessary to arrange the logic configuration electrodes 18a-18d to be aligned along the Y direction as shown in FIG. 1A. As long as each one of the semiconductor portions includes one of the logic configuration electrodes and two of the input electrode, the logic calculation can be performed regardless of the arrangement of the these electrodes.

(Logic Calculation with the Nonvolatile Logic Circuit 20)

Then, with referring to FIG. 4-7, the logic calculation with the nonvolatile logic circuit 20 is described.

The nonvolatile logic circuit 20 executes logic calculation of two inputs and output one calculated output. The two input signals are a first input signal and a second input signal.

The logic calculation is roughly divided into a logic configuration step using the logic configuration electrodes 18a-18d and an input writing step using the input electrodes 17a-17h.

First, the nonvolatile logic circuit 20 is configured to have one logic of logical conjunction (AND), logical disjunction (OR), logical non-conjunction (NAND), logical non-disjunction (NOR), and logical exclusive disjunction (XOR) by using the logical configuration electrodes 18a-18d. Needless to say, more than one logic are not configured simultaneously in the nonvolatile logic circuit 20.

Then, the first and second input signals are input to the nonvolatile logic circuit 20 through the input electrodes 17a-17h.

(Logic Configuration)

Before the input writing step, the nonvolatile logic circuit 20 is configured to have one logic selected from logical conjunction (AND), logical disjunction (OR), logical non-conjunction (NAND), logical non-disjunction (NOR), and logical exclusive disjunction (XOR).

The procedure of the logic configuration is described below. Preferably, a first reset operation is executed before the logic configuration step. In the first reset operation, a voltage Vin is applied to the logical configuration electrodes 18a-18d, and a voltage Vreset, which satisfies an inequality of Vin<Vreset, is applied to the control electrode 12. For example, 0 volt is applied to the logical configuration electrodes 18a-18d while 10 volt is applied to the control electrode 12. Thus, all of the polarization in the ferroelectric film 13 is configured to be upward.

Voltages V1, VA, VB, VC, and VD are applied to the control electrode 12, the first logical configuration electrode 18a, the second logical configuration electrode 18b, the third logical configuration electrode 18c, and the fourth logical configuration electrode 18d, respectively in the logical configuration step.

This voltage application step causes the respective polarizations of the portions of the ferroelectric film 13 located below the respective logical configuration electrodes 18a-18d to be upward or downward. This causes the respective portions of the semiconductor film 14 located below the respective logical configuration electrodes 18a-18d to have either of a high resistance state or a low resistance state. By combinations of the high resistance state and the low resistance state, the nonvolatile logic circuit 20 is configured to have one logic selected from logical conjunction (AND), logical disjunction (OR), logical non-conjunction (NAND), logical non-disjunction (NOR), logical exclusive disjunction (XOR).

The following example is for the case in which the semiconductor film is an n-type semiconductor. When the semiconductor film is a p-type semiconductor, all inequality sign should be reversed.

When the logical conjunction (AND) is to be configured, the voltages which satisfy the following inequality (I) are applied.

$$V1>VA, V1<VB, V1<VC, \text{ and } V1<VD \quad (I)$$

For example, while V1 is maintained to be 0 volt, VA of −10V, VB of 10V, VC of 10V, and VD of 10V are applied.

These voltages cause that only the portion of the semiconductor film 14 below the logic configuration electrode 18a becomes a low resistance state (i.e., "ON" state) while the portions of the semiconductor film 14 below the logic configuration electrodes 18b, 18c and 18d are high resistance states (i.e., "OFF" state).

When the logical disjunction (OR) is to be configured, the voltages which satisfy the following inequality (II) are applied.

$$V1>VA, V1>VB, V1>VC, \text{ and } V1<VD \quad \text{(II)}$$

For example, while V1 is maintained to be 0 volt, VA of −10V, VB of −10V, VC of −10V, and VD of 10V are applied. These voltages cause that the portions of the semiconductor film 14 below the logic configuration electrodes 18a, 18b and 18c become low resistance states (i.e., "ON" state) while only the portion of the semiconductor film 14 below the logic configuration electrode 18d is a high resistance state (i.e., "OFF" state).

When the logical non-conjunction (NAND) is to be configured, the voltages which satisfy the following inequality (III) are applied.

$$V1<VA, V1>VB, V1>VC, \text{ and } V1>VD \quad \text{(III)}$$

For example, while V1 is maintained to be 0 volt, VA of 10V, VB of −10V, VC of −10V, and VD of −10V are applied. These voltages cause that the portions of the semiconductor film 14 below the logic configuration electrodes 18b, 18c and 18d become low resistance states (i.e., "ON" state) while only the portion of the semiconductor film 14 below the logic configuration electrode 18a is a high resistance state (i.e., "OFF" state).

When the logical non-disjunction (NOR) is to be configured, the voltages which satisfy the following inequality (IV) are applied.

$$V1<VA, V1<VB, V1<VC, \text{ and } V1>VD \quad \text{(IV)}$$

For example, while V1 is maintained to be 0 volt, VA of 10V, VB of 10V, VC of 10V, and VD of −10V are applied. These voltages cause that only the portion of the semiconductor film 14 below the logic configuration electrode 18d becomes a low resistance state (i.e., "ON" state) while the portions of the semiconductor film 14 below the logic configuration electrodes 18a, 18b and 18c are high resistance states (i.e., "OFF" state).

When the logical exclusive disjunction (XOR) is to be configured, the voltages which satisfy the following inequality (V) are applied.

$$V1<VA, V1>VB, V1>VC, \text{ and } V1<VD \quad \text{(V)}$$

For example, while V1 is maintained to be 0 volt, VA of 10V, VB of −10V, VC of −10V, and VD of 10V are applied. These voltages cause that the portions of the semiconductor film 14 below the logic configuration electrodes 18b and 18c become low resistance states (i.e., "ON" state) while the portions of the semiconductor film 14 below the logic configuration electrodes 18a and 18d are high resistance states (i.e., "OFF" state).

FIG. 4 summarizes the states of the logical configuration electrodes 18a-18d on logical configuration. FIG. 5 shows the potential applied in the logical configuration step. "ON" and "OFF" states correspond to applying −10V and 10V, respectively. The potential of the control electrode 12 is maintained to be constant. Preferably, it is maintained to be 0 volt.

(Input Writing)

The procedure of the input writing step is described below. In the input writing step, one state selected from first to fourth states is written into the nonvolatile logic circuit 20. Needless to say, more than one state are not written simultaneously into the nonvolatile logic circuit 20.

Preferably, a second reset operation is executed before the input writing. In the second reset operation, a voltage Vin is applied to the input electrodes 17a-17h, and a voltage Vreset, which satisfies an inequality of Vin<Vreset, is applied to the control electrode 12. For example, 0 volt is applied to the input electrodes 17a-17h while 10 volt is applied to the control electrode 12. Thus, all of the polarizations in the ferroelectric film 13 under the input electrodes are configured to be upward.

Figure 2:
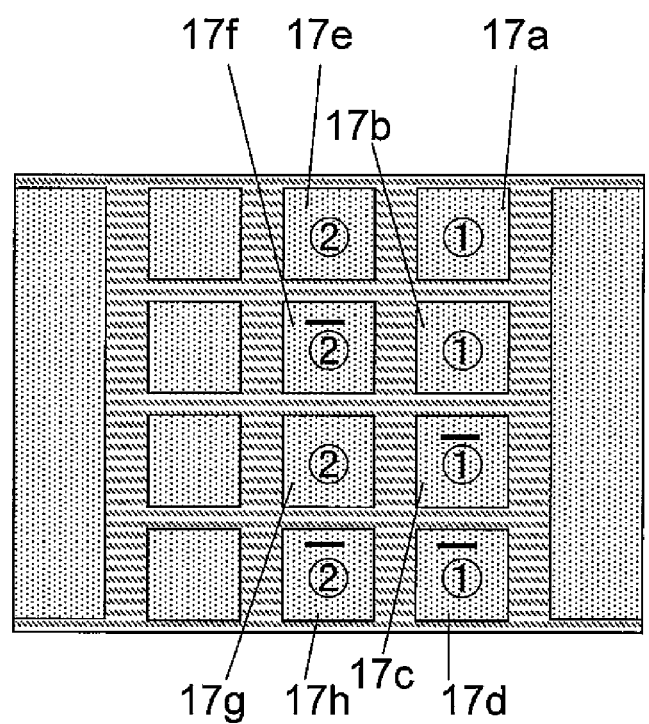
FIG. 2 shows the relationship between the input electrodes 17a-17h and the first and second input signals in the one example of the present disclosure.
Figure 7A:
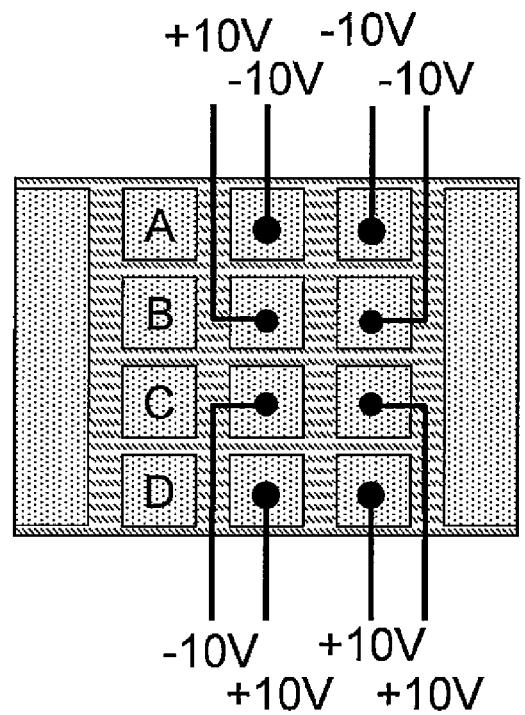
FIG. 7A shows examples of the voltages applied to the logic configuration electrodes 18a-18d in the first state.
Figure 7B:
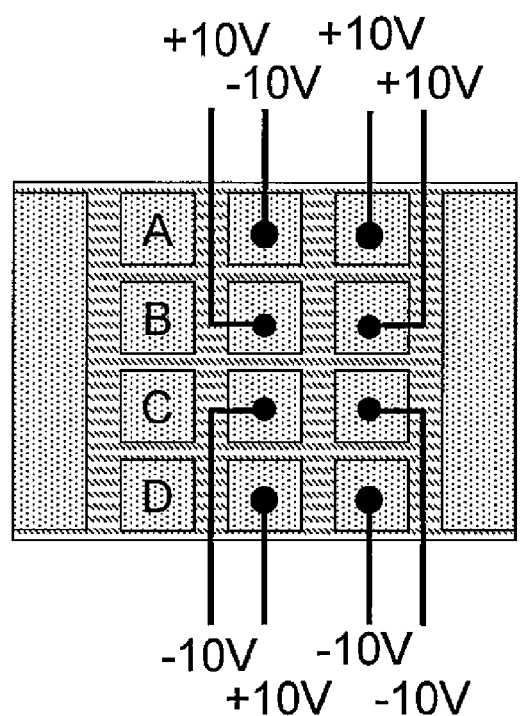
FIG. 7B shows examples of the voltages applied to the logic configuration electrodes 18a-18d in the second state.
Figure 7C:
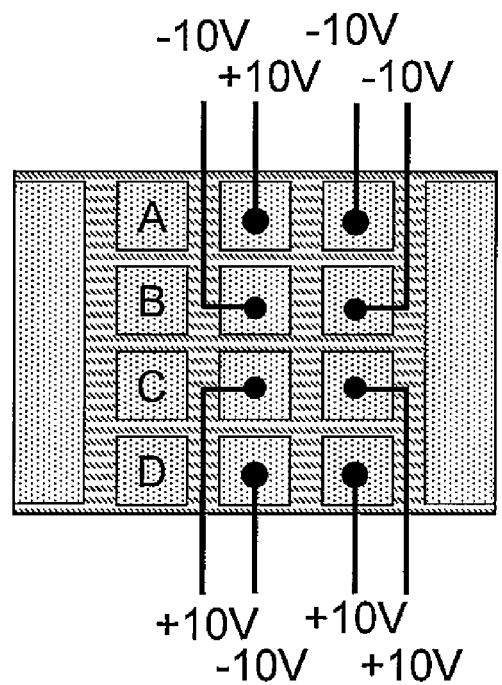
FIG. 7C shows examples of the voltages applied to the logic configuration electrodes 18a-18d in the third state.
Figure 7D:
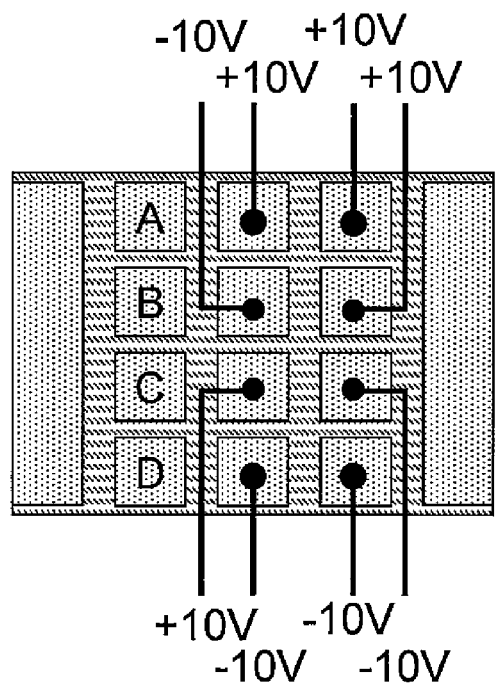
FIG. 7D shows examples of the voltages applied to the logic configuration electrodes 18a-18d in the fourth state.

As shown in FIG. 2, the first input signal is input to the first input electrode 17a and the second input electrode 17b. The negation of the first input signal is input to the third input electrode 17c and the fourth input electrode 17d. The second input signal is input to the fifth input electrode 17e and the seventh input electrode 17g. The negation of the second input signal is input to the sixth input electrode 17f and the eighth input electrode 17h. On the basis of the table of truth value shown in FIG. 3, the execution result of logical operation is output.

In the input writing step, voltages V1, Va, Vb, Vc, Vd, Ve, Vf, Vg, and Vh are applied to the control electrode 12, the first input electrode 17a, the second input electrode 17b, the third input electrode 17c, the fourth input electrode 17d, the fifth input electrode 17e, the sixth input electrode 17f, the seventh input electrode 17g, and the eighth input electrode 17h, respectively.

An equality of Va=Vb is satisfied because the first input signal is input to the first input electrode 17a and the second input electrode 17b. For the same reason, equality sets Vc=Vd, Ve=Vg, and Vf=Vh are satisfied.

This voltage application step causes the respective polarizations of the portions of the ferroelectric film 13 located below the respective input electrodes 17a-17h to be upward or downward. This causes the respective portion of the semiconductor film 14 located below the respective input electrodes 17a-17h to have either of a high resistance state or a low resistance state. Thus, one state selected from the first to fourth states is written into the nonvolatile logic circuit 20.

When the first state is written, voltages which satisfy the following inequality (VI) are applied.

$$V1>Va, V1>Vb, V1<Vc, V1<Vd, V1>Ve, V1<Vf,$$
$$V1>Vg, \text{ and } V1<Vh \quad \text{(VI)}$$

For example, while V1 is maintained to be 0 volt, Va of −10V, Vb of −10V, Vc of 10V, Vd of 10V, Ve of −10V, Vf of 10V, Vg of −10V, and Vh of 10V are applied. When it is defined that −10V and +10V correspond to true(1) and false (0), respectively, in the first state, true(1), true(1), false(0), false(0), true(1), false(0), true(1), and false(0) are input to the first to eighth input electrodes 17a-17h, respectively.

When the second state is written, voltages which satisfy the following inequality (VII) are applied, $$V1<Va, V1<Vb, V1>Vc, V1>Vd, V1>Ve, V1<Vf,$$
$$V1>Vg, \text{ and } V1<Vh \quad \text{(VII)}$$

For example, while V1 is maintained to be 0 volt, Va of 10V, Vb of 10V, Vc of −10V, Vd of −10V, Ve of −10V, Vf of 10V, Vg of −10V, and Vh of 10V are applied. Namely, in the second state, false(0), false(0), true(1), true(1), true(1), false(0), true (1), and false(0) are input to the first to eighth input electrodes 17a-17h, respectively.

When the third state is written, voltages which satisfy the following inequality (VIII) are applied, $$V1>Va, V1>Vb, V1<Vc, V1<Vd, V1<Ve, V1>Vf,$$
$$V1<Vg, \text{ and } V1>Vh \quad \text{(VIII)}$$

For example, while V1 is maintained to be 0 volt, Va of −10V, Vb of −10V, Vc of 10V, Vd of 10V, Ve of 10V, Vf of −10V, Vg of 10V, and Vh of −10V are applied. Namely, in the third state, true(1), true(1), false(0), false(0), false(0), true(1), false(0), and true(1) are input to the first to eighth input electrodes 17a-17h, respectively.

When the fourth state is written, voltages which satisfy the following inequality (IX) are applied, $$V1<Va, V1<Vb, V1>Vc, V1>Vd, V1<Ve, V1>Vf, V1<Vg, \text{ and } V1>Vh \qquad (IX)$$

For example, while V1 is maintained to be 0 volt, Va of 10V, Vb of 10V, Vc of −10V, Vd of −10V, Ve of 10V, Vf of −10V, Vg of 10V, and Vh of −10V are applied. Namely, in the fourth state, false(0), false(0), true(1), true(1), false(0), true(1), false (0), and true(1) are input to the first to eighth input electrodes 17a-17h, respectively.

FIG. 6 summarizes the states of the input electrodes 17a-17h in input writing step. The values "1" and "0" in the first and second input signals shown in FIG. 3 correspond to −10V and 10V of the input voltages shown in FIG. 6, respectively. The potential of the control electrode 12 is maintained to be constant. Preferably, it is maintained to be 0 volt.

FIG. 7A to FIG. 7D correspond to the first to fourth states, respectively.

Figure 8:
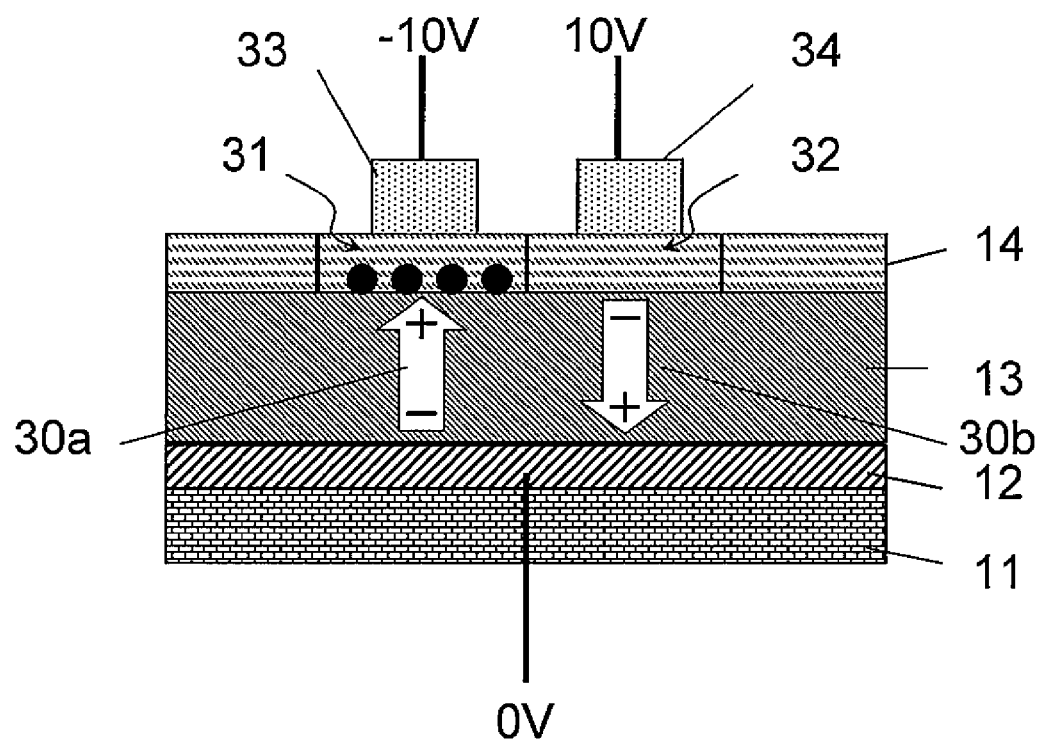
FIG. 8 is an exemplary cross-sectional view showing the difference of the polarization depending on the voltages applied to the electrodes.

FIG. 8 illustrates the polarization states of the ferroelectric film 13 and the states of the semiconductor film 14 when −10V and 10V are applied to the electrodes 33, 34 disposed on the semiconductor film 14 (e.g., three logic configuration electrodes 18a-18d or the input electrodes 17a-17h). The semiconductor region 31 located below the electrode 33 to which −10V is applied has low resistance because of accumulation of the electrons generated by polarization 30a of the ferroelectric film 13. The semiconductor region 32 located below the electrode 33 to which 10V is applied has high resistance because of depletion of the electrons caused by polarization 30b of the ferroelectric film 13.

After the input writing step, the nonvolatile logic circuit may be turned off.

It is noted that the logic configuration step and the input writing step can be performed at the same time, or in any order.

(Reading)

A step of reading information from the nonvolatile logic circuit 20 is described below. A potential difference is applied between the power electrode 15 and the output electrode 16 to measure the current flowing through the semiconductor film 14. On the measuring of the current, it is preferred that no voltage is applied to the control electrode 12, the logic configuration electrodes 18a-18d and the input electrodes 17a-17h. Alternatively, the voltages of these electrodes may be maintained at 0 volts.

It is preferred that the potential difference between the power electrode 15 and the output electrode 16 is not more than one-fifth of the potential difference between the control electrode 12 and the logic configuration electrodes 18a-18d and between the control electrode 12 and the input electrodes 17a-17h used in the logic configuration step and the input writing step. An example of the potential difference between the power electrode 15 and the output electrode 16 is 0.1 V.

A resistance value is determined depending on the magnitude of the electrical current. Namely, it is determined which one of the low and high resistance states the non-volatile logic circuit 20 has, on the basis of the magnitude of the current.

When logical conjunction (AND) is configured in the nonvolatile logic circuit 20, and the first state has been written, the semiconductor film 14 between the power electrode and the output electrode is a low resistance state. When the second, third, or fourth state has been written, the semiconductor film 14 between the power electrode and the output electrode is a high resistance state.

When logical disjunction (OR) is configured in the nonvolatile logic circuit 20, and the first, second, or third states has been written, the semiconductor film 14 between the power electrode and the output electrode is a low resistance states. When the fourth state has been written, the semiconductor film 14 between the power electrode and the output electrode is a high resistance state.

When logical non-conjunction (NAND) is configured in the nonvolatile logic circuit 20, and the second, third, or fourth states has been written, the semiconductor film 14 between the power electrode and the output electrode is a low resistance state. When the first state has been written, the semiconductor film 14 between the power electrode and the output electrode is a high resistance state.

When logical non-disjunction (NOR) is configured in the nonvolatile logic circuit 20, and the fourth state has been written, the semiconductor film 14 between the power electrode and the output electrode is a low resistance state. When the first, second, or third states has been written, the semiconductor film 14 between the power electrode and the output electrode is a high resistance state.

When logical exclusive disjunction (XOR) is configured in the nonvolatile logic circuit 20, and the second or third states has been written, the semiconductor film 14 between the power electrode and the output electrode is a low resistance state. When the first or fourth states has been written, the semiconductor film 14 between the power electrode and the output electrode is a high resistance state.

The high and low resistance states correspond to false and true of the logic based on the first and second input signals, respectively. Thus, the nonvolatile logic circuit 20 can be programmed as a circuit having one logic selected from logical conjunction (AND), logical disjunction (OR), logical non-conjunction (NAND), logical non-disjunction (NOR), and logical exclusive disjunction (XOR).

The following describes one example of a fabrication method of the nonvolatile logic circuit.

(1) A titanium film with a thickness of 5 nm and a platinum film with a thickness of 30 nm were formed in this order on a silicon substrate 11 with a surface coated with silicon oxide by using an electron beam deposition method. Furthermore, a SrRuO$_3$ (hereinafter, SRO) film with a thickness of 10 nm was formed with a pulse laser deposition method. Thus, a control electrode 12 was formed on the silicon substrate 11.

(2) A ferroelectric film 13 composed of Pb(Zr,Ti)O$_3$ with a thickness of 450 nm was formed by using a pulsed laser deposition (PLD) method with a substrate temperature of 700 degrees Celsius.

(3) The temperature of the substrate was set to 400 degrees Celsius, and a semiconductor film 14 formed of n-type zinc oxide with a thickness of 30 nm was formed in the same PLD chamber.

(4) The patterns of a resist were formed on the semiconductor film 14 with photolithography. Subsequently, the portions of the semiconductor 14 not to be covered with the resist patterns were removed with etching using nitric acid.

(5) Subsequently, a resist was further formed and patterned on the semiconductor film 14 with photolithography. A titanium film with a thickness of 5 nm and a platinum film with a thickness of 30 nm were formed with an electron beam deposition method. The resist was removed to form the power electrode 15, output electrode 16, the logic configuration electrodes 18a-18d, and the input electrodes 17a-17h.

The obtained nonvolatile logic circuit 20 had the logic configuration electrodes 18a-18d with 100 μm square, the input electrodes 17a-17h with 100 μm square, and electrode distance with 10 μm.

The one state selected from the first to fourth states was written into the nonvolatile logic circuit 20 on the basis of FIG. 6 and FIG. 7. Subsequently, the potential difference of 0.1V was applied between the power electrode 15 and the output electrode 16 to calculate the resistance value of the nonvolatile logic circuit 20 on the basis of the current flowing between the current electrode 15 and the output electrode 16.

Figure 9:
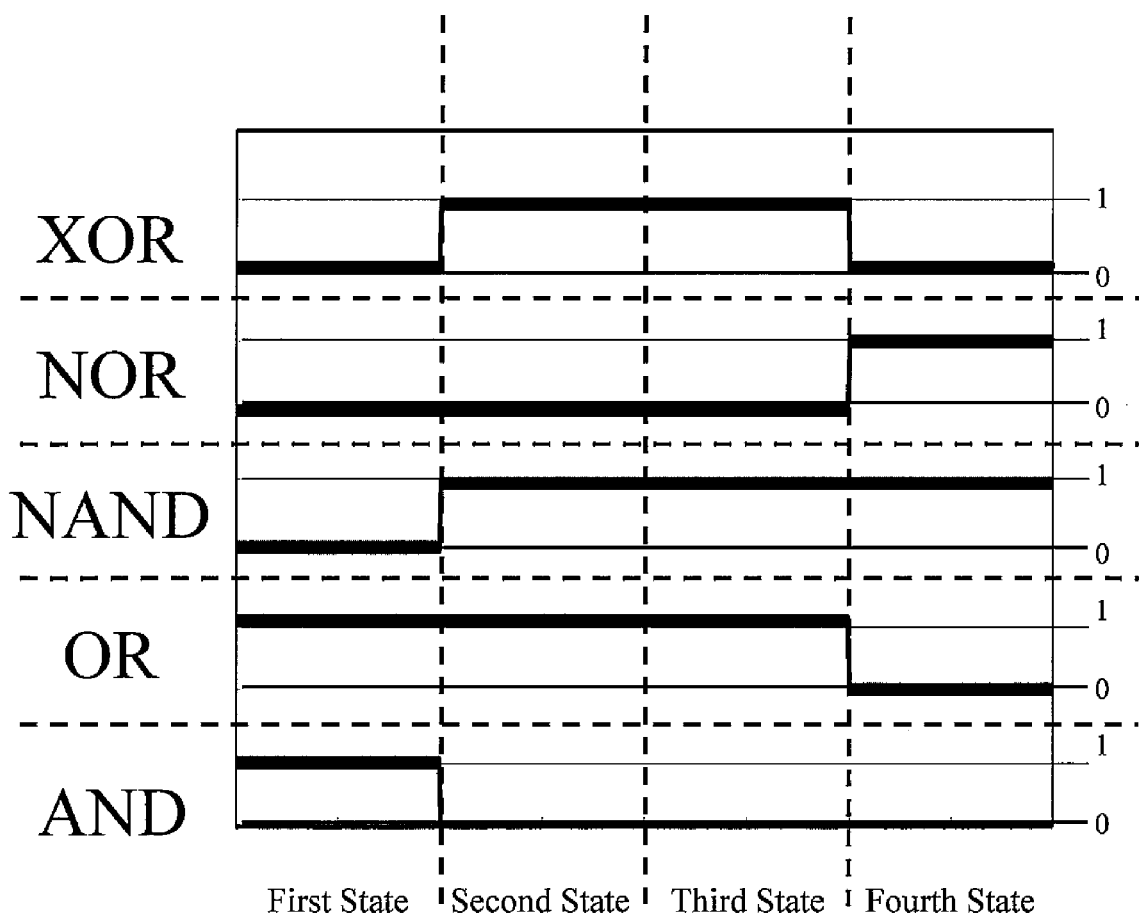
FIG. 9 shows the relationships among the first and second input signals, the five logics, and maximum and minimum resistance value in the first to fourth states.
Figure 10:
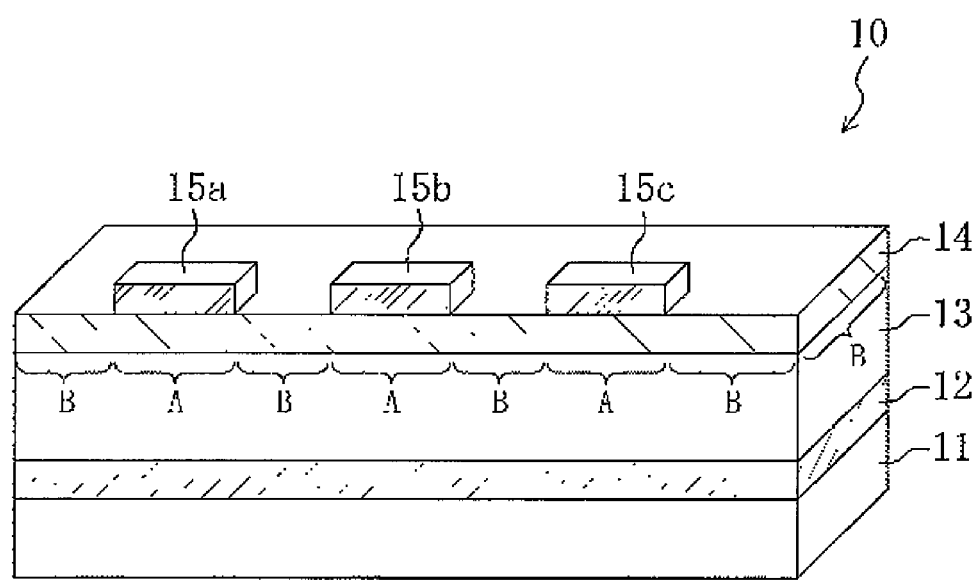
FIG. 10 shows FIG. 1 of US 2009/0097299.
Figure 11A:
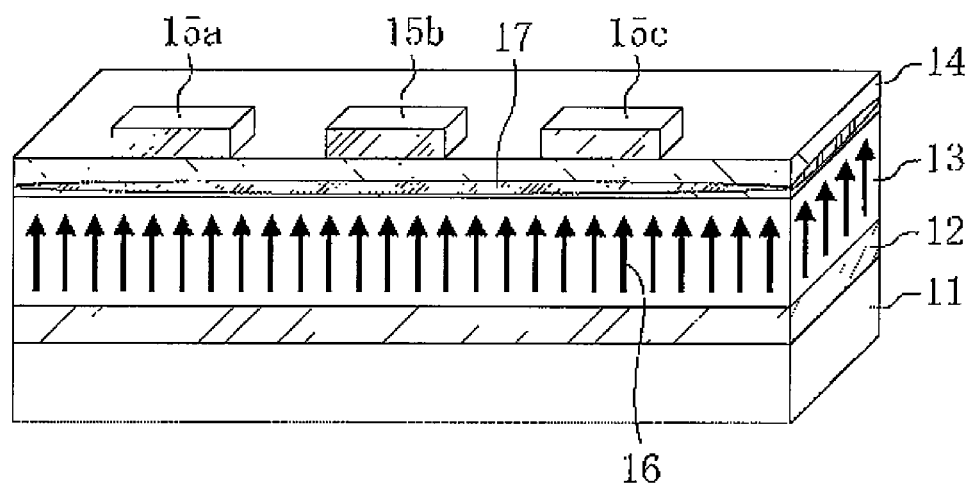
FIG. 11A shows FIG. 2(a) of US 2009/0097299.
Figure 11B:
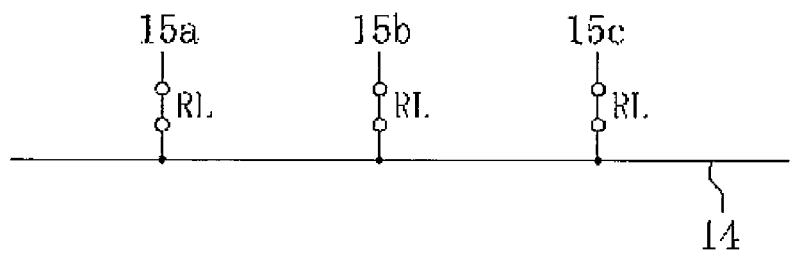
FIG. 11B shows FIG. 2(b) of US 2009/0097299.
Figure 12A:
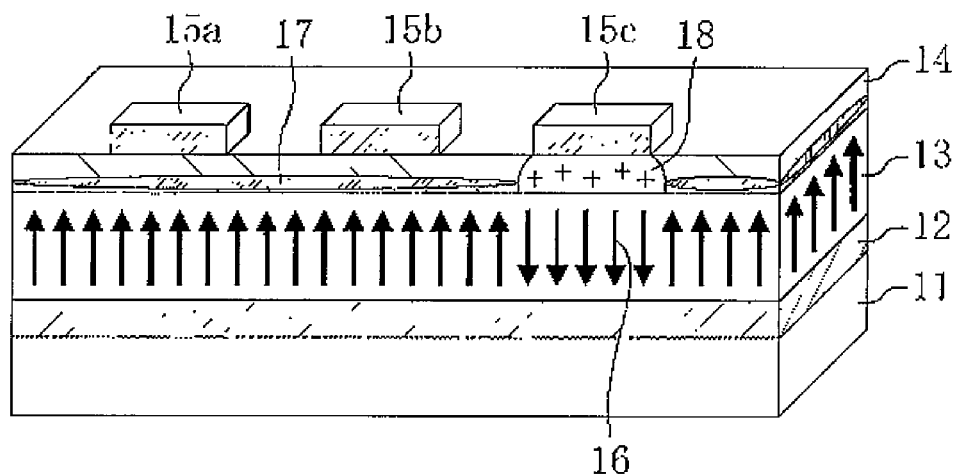
FIG. 12A shows FIG. 3(a) of US 2009/0097299.
Figure 12B:
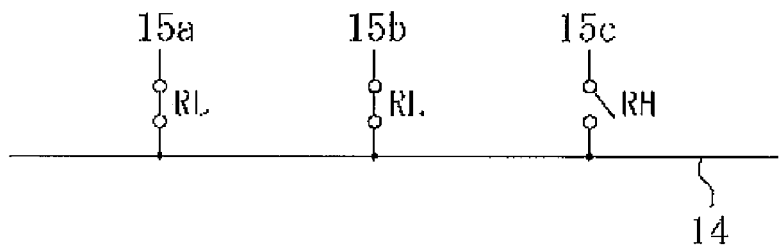
FIG. 12B shows FIG. 3(b) of US 2009/0097299.

FIG. 9 shows the resistance values calculated in the first to fourth states. "0" and "1" mean the maximum and minimum values of the resultant resistance values, respectively.

As understood from FIG. 9, when the logical conjunction (AND) was configured, and the first state was written, the output was "1". When the second, third, or the fourth state was written, the output was were "0".

When logical disjunction (OR) was configured, and the first, second, or third state was written, the output was "1". When the fourth state was written, the output was "0".

When logical non-conjunction (NAND) was configured, and the second, third, or fourth state was written, the output was "1". When the first state was written, the output was "0".

When logical non-disjunction (NOR) was configured, and the fourth state was written, the output was "1". When the first, second, or third states was written, the output was "0".

When logical exclusive disjunction (XOR) was configured, and the second or third state was written, the output was "1". When the first or fourth states was written, the output was "0".

INDUSTRIAL APPLICABILITY

The present disclosure can provide a novel nonvolatile semiconductor device which can be switched to any one of AND, OR, NAND, NOR, or XOR, and the operation method of the same. In other words, each of the logic configuration electrodes and input electrode function as a programmable switch which controls conductivity (i.e., resistance) of the underlying semiconductor film.

LIST OF REFERENTIAL MARKS

11: Substrate
12: Control Electrode
13: Ferroelectric film
14: Semiconductor film
14a: First semiconductor portion
14b: Second semiconductor portion
14c: third semiconductor portion
14d: fourth semiconductor portion
15: Power electrode
16: Output electrode
17a: First input electrode
17b: Second input electrode
17c: Third input electrode
17d: Fourth input electrode
17e: Fifth input electrode
17f: Sixth input electrode
17g: Seventh input electrode
17h: Eighth input electrode
18a: First logic configuration electrode
18b: Second logic configuration electrode
18c: Third logic configuration electrode
18d: Fourth logic configuration electrode
20: Nonvolatile logic circuit
30a: Upward polarization in the ferroelectric film 13
30b: Downward polarization in the ferroelectric film 13
31: Low resistance portion in the semiconductor film 14
32: High resistance portion in the semiconductor film 14
33: Electrode to which signal "1" is applied.
34: Electrode to which signal "0" is applied.
4a: First insulation part
4b: Second insulation part
4c: Third insulation part

What is claimed is:

1. A method of operating a non-volatile logic circuit, the method comprising:
a step (a) of preparing the non-volatile logic circuit, wherein:
the non-volatile logic circuit comprises a control electrode, a ferroelectric layer, a semiconductor layer, and an electrode group,
the control electrode, the ferroelectric layer, the semiconductor layer, and the electrode group are stacked in this order,
the semiconductor layer is a p-type semiconductor film,
the semiconductor film is divided into first to fourth semiconductor portions,
the electrode group comprises a power electrode, an output electrode, first to eighth input electrodes, and first to fourth logic configuration electrodes,
when X direction, Y-direction, and Z-direction denote a longitudinal direction of the ferroelectric layer, a direction orthogonal to the longitudinal direction, and a layer stack direction, respectively,
the first to eighth input electrodes and the first to fourth logic configuration electrodes are interposed between the power electrode and the output electrode along the X-direction,
the first to fourth logic configuration electrodes are disposed along the Y-direction,
the first to fourth input electrodes are disposed along the Y-direction,
the first to fourth input electrodes are disposed along the Y-direction,
the first input electrode, the fifth input electrode, and the first logic configuration electrode are disposed along the X-direction on the first semiconductor portion,
the second input electrode, the sixth input electrode, and the second logic configuration electrode are disposed along the X-direction on the second semiconductor portion,
the third input electrode, the seventh input electrode, and the third logic configuration electrode are disposed along the X-direction on the third semiconductor portion,
the fourth input electrode, the eighth input electrode, and the fourth logic configuration electrode are disposed along the X-direction on the fourth semiconductor portion,
a first insulation part is interposed between the first semiconductor portion and the second semiconductor portion to insulate the first semiconductor portion from the second semiconductor portion,
a second insulation part is interposed between the second semiconductor portion and the third semiconductor portion to insulate the second semiconductor portion from the third semiconductor portion, and
a third insulation part is interposed between the third semiconductor portion and the fourth semiconductor portion to insulate the third semiconductor portion from the fourth semiconductor portion;
a step (b) of configuring one logic in the nonvolatile logic circuit, the one logic being selected from logical conjunction (AND), logical disjunction (OR), logical non-conjunction (NAND), logical non-disjunction (NOR), and logical exclusive disjunction (XOR), wherein:

voltages V1, VA, VB, VC, and VD are applied to the control electrode, and the first to fourth logic configuration electrodes, respectively, when the logical conjunction (AND) is configured, the voltages which satisfy the following inequality (I) are applied, $$V1<VA, V1>VB, V1>VC, \text{ and } V1>VD \quad (I),$$

when the logical disjunction (OR) is configured, the voltages which satisfy the following inequality (II) are applied, $$V1<VA, V1<VB, V1<VC, \text{ and } V1>VD \quad (II),$$

when the logical non-conjunction (NAND) is configured, the voltages which satisfy the following inequality (III) are applied, $$V1>VA, V1<VB, V1<VC, \text{ and } V1<VD \quad (III),$$

when the logical non-disjunction (NOR) is configured, the voltages which satisfy the following inequality (IV) are applied, $$V1>VA, V1>VB, V1>VC, \text{ and } V1<VD \quad (IV),$$

when the logical exclusive disjunction (XOR) is configured, the voltages which satisfy the following inequality (V) are applied, $$V1>VA, V1<VB, V1<VC, \text{ and } V1>VD \quad (V);$$

a step (c) of writing one state selected from the group consisting of first to fourth states into the non-volatile logic circuit, wherein:

voltages Va to Vh are applied to the first to eighth input electrodes, respectively, when the first state is written, voltages which satisfy the following inequality (VI) are applied, $$V1<Va, V1<Vb, V1>Vc, V1>Vd, V1<Ve, V1>Vf, V1<Vg, \text{ and } V1>Vh \quad (VI),$$

when the second state is written, voltages which satisfy the following inequality (VII) are applied, $$V1>Va, V1>Vb, V1<Vc, V1<Vd, V1<Ve, V1>Vf, V1<Vg, \text{ and } V1>Vh \quad (VII),$$

when the third state is written, voltages which satisfy the following inequality (VIII) are applied, $$V1<Va, V1<Vb, V1>Vc, V1>Vd, V1>Ve, V1<Vf, V1>Vg, \text{ and } V1<Vh \quad (VIII),$$

when the fourth state is written, voltages which satisfy the following inequality (IX) are applied, $$V1>Va, V1>Vb, V1<Vc, V1<Vd, V1>Ve, V1<Vf, V1>Vg, \text{ and } V1<Vh \quad (IX); \text{ and}$$

a step (d) of measuring current generated by applying a potential difference between the power electrode and the output electrode to determine whether the semiconductor layer between the power electrode and the output electrode is a high resistance state or a low resistance state on the basis of the current.

2. The method according to claim 1, wherein, in the step (c), a first input signal which is either true or false is input to both of the first and second input electrodes, the negation of the first input signal is input to both of the third and fourth input electrodes, a second input signal which is either true or false is input to both of the fifth and seventh input electrodes, the negation of the second input signal is input to both of the sixth and eighth input electrodes, the high and low resistance states correspond respectively to false and true of the one logic on the basis of the first and second input signals.

3. The method according to claim 1, further comprising the following step (e) between the step (a) and the step (b):

a step (e) of applying voltage Vin to the first to fourth logic configuration electrodes and applying voltage Vreset, where Vreset<Vin, to the control electrode.

4. The method according to claim 1, further comprising the following step (f) between the step (b) and the step (c):

a step (f) of applying voltage Vin to the first to eighth input electrodes and applying voltage Vreset, where Vreset<Vin, to the control electrode.

5. The method according to claim 1, further comprising the following step (f) between the step (b) and the step (c):

a step (f) of applying voltage Vin to the first to eighth input electrodes and applying voltage Vreset, where Vreset<Vin, to the control electrode.

6. The method of claim 1, further comprising the following step (g) between the step (c) and the step (d):

a step (g) of turning off the non-volatile logic circuit.

7. The method of claim 1, wherein an interior or a bottom surface of the ferroelectric film is exposed at respective bottom surfaces of the first to third insulation parts.

8. The method of claim 1, wherein at least one of the first to third insulation parts is in a form of a groove.

9. The method of claim 8, wherein the groove is vacuumed or depressurized.

10. The method of claim 8, wherein the groove is filled with air.

11. The method of claim 1, wherein at least one of the first to third insulation parts is made of an insulator.

12. The method of claim 11, wherein the insulator is silicon oxide.

* * * * *